United States Patent
Yamamoto et al.

(10) Patent No.: US 7,034,638 B2
(45) Date of Patent: Apr. 25, 2006

(54) SAW FILTER

(75) Inventors: Yasushi Yamamoto, Kanagawa (JP); Tatsunori Onzuka, Kanagawa (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 10/665,817

(22) Filed: Sep. 18, 2003

(65) Prior Publication Data

US 2004/0058664 A1    Mar. 25, 2004

(30) Foreign Application Priority Data

Sep. 18, 2002  (JP) ............... 2002-271648

(51) Int. Cl.
*H03H 9/64*    (2006.01)
(52) U.S. Cl. .............. 333/193; 333/133; 310/313 R
(58) Field of Classification Search ........... 333/193, 333/194, 195, 196, 133; 310/313 R, 313 B
See application file for complete search history.

(56) References Cited

U.S. PATENT DOCUMENTS

| | | | | |
|---|---|---|---|---|
| 5,559,481 | A | * | 9/1996 | Satoh et al. ............ 333/193 |
| 5,933,062 | A | * | 8/1999 | Kommrusch ............ 333/193 |
| 2004/0119561 | A1 | * | 6/2004 | Omote ................. 333/133 |
| 2004/0140866 | A1 | * | 7/2004 | Taniguchi ............. 333/133 |

FOREIGN PATENT DOCUMENTS

| | | |
|---|---|---|
| EP | 0 541 284 A1 | 10/1992 |
| JP | 5-183380 | 7/1993 |
| JP | 10-65490 A * | 6/1998 |

* cited by examiner

*Primary Examiner*—Dean Takaoka
(74) *Attorney, Agent, or Firm*—Muirhead and Saturnelli, LLC (57) ABSTRACT

A ladder SAW (surface acoustic wave) filter which includes a first SAW resonator disposed in a parallel arm and a second SAW resonator disposed in a series arm, has an inductor connected parallel to at least one of the first SAW resonator and the second SAW resonator. The frequency of a resonance point or an anti-resonance point of the at least one of the first SAW resonator and the second SAW resonator is adjusted by changing the inductance value of the inductor.

6 Claims, 7 Drawing Sheets

SAW FILTER

BACKGROUND OF THE INVENTION

1. Field of the Invention

The present invention relates to a SAW (Surface Acoustic Wave) filter, and more particularly to a SAW filter having filter characteristics adjustable in an assembling process therefor and providing a wide passband width and a large attenuation level.

2. Description of the Related Art

In recent years, small-size communication devices such as cellular phones or the like have seen widespread use among many users. Such small-size communication devices employ many filters as frequency selecting devices. A transversal SAW filter which has an IDT (InterDigital Transducer) disposed on a surface of a piezoelectric member for selecting a frequency component based on an interaction between a surface acoustic wave propagated through the surface of the piezoelectric member and the IDT is widely used as a filter in such small-size communication devices because it is relatively inexpensive, lends itself to being reduced in size, and can easily be mass-produced.

However, the transversal SAW filter has, in principle, filter characteristics such as a passband width and an attenuation level determined by an electrode pattern of the IDT that has been adopted when it has been designed. Therefore, if the characteristics of a completed SAW filter do not satisfy desired specifications, then a different SAW filter has to be designed again. Even with such efforts, it is generally difficult for a SAW filter to achieve a wide passband and a large attenuation level outside of the passband.

Japanese laid-open patent publication No. 5-183380 (JP-A-5-183380) discloses a ladder filter having SAW resonators in which an inductor is inserted in series to the SAW resonator in the parallel arm and/or the series arm of the ladder filter. The ladder filter achieves a wide passband and a large suppression level outside of the passband by moving a resonance point and an anti-resonance point depending on the inductance value of the inserted inductor. The SAW resonator in the series arm is a SAW resonator inserted in a path interconnecting input and output terminals of the ladder filter, and the SAW resonator in the parallel arm is a SAW resonator interconnecting a node on a path interconnecting input and output terminals of the ladder filter and a common ground point.

However, because the inductor is inserted in series to the SAW resonator in the ladder filter revealed in JP-A-5-183380, the ladder filter is disadvantageous in that it suffers small degree of freedom in designing and its productivity is low since the ladder filter needs to be designed and prototyped again and again when the ladder filter is actually manufactured.

SUMMARY OF THE INVENTION

It is therefore an object of the present invention to provide a SAW filter which can be designed with large degree of freedom, can easily achieve desired filter characteristics, and has its filter characteristics adjustable in an assembling process.

According to the present invention, the above object can be achieved by a ladder SAW filter comprising a first SAW resonator disposed in a parallel arm, a second SAW resonator disposed in a series arm, and an inductor connected parallel to at least one of the first SAW resonator and the second SAW resonator, wherein the frequency of a resonance point or an anti-resonance point of the at least one of the first SAW resonator and the second SAW resonator is adjusted by the inductor.

If the inductor is connected parallel to the first SAW resonator, the frequency of a resonance point of the first SAW resonator may have been set substantially on an attenuation peak of filter characteristics of the ladder SAW filter, and then the frequency of an anti-resonance point of the first SAW resonator may be set in a passband of the filter characteristics depending on the inductance value of the inductor. Similarly, if the inductor is connected parallel to the second SAW resonator, the frequency of an anti-resonance point of the second SAW resonator may have been set substantially in a passband of filter characteristics, and the frequency of a resonance point of the second SAW resonator may be set on an attenuation peak of the filter characteristics depending on the inductance value of the inductor.

According to the present invention, there is provided a SAW filter which is capable of achieving a wide passband and a large attenuation level outside of the passband, causes a small insertion loss, and is useful in applications.

DETAILED DESCRIPTION OF THE INVENTION

Figure 1:
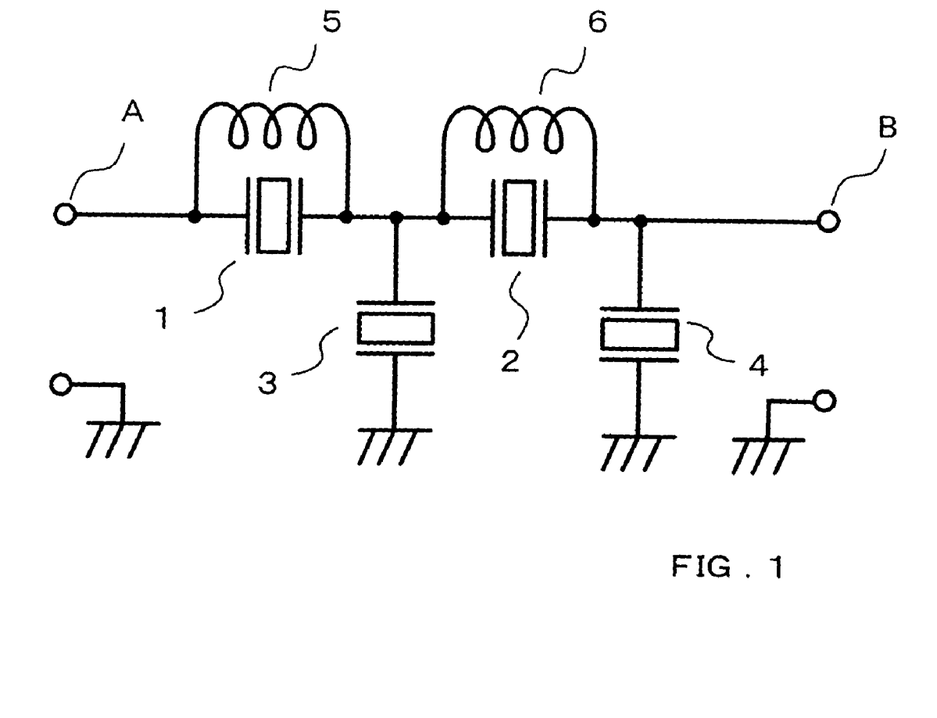
FIG. 1 is a circuit diagram of a SAW filter according to an embodiment of the present invention.

A SAW filter according to an embodiment of the present invention as shown in FIG. 1 comprises a two-stage ladder filter having four SAW resonators 1 to 4. The SAW filter has input terminal A on the left end thereof as shown and output terminal B on the right end thereof as shown. Saw resonators 1, 2 in series arms are inserted in series between input and output terminals A, B. Saw resonator 3 in a parallel arm is inserted between the junction between saw resonators 1, 2 and a ground point. Saw resonator 4 in a parallel arm is inserted between the junction between saw resonator 2 and output terminal B and a ground point. The SAW filter also has inductors 5, 6 connected respectively parallel to SAW resonators 1, 2 in the series arms.

Figure 2A:
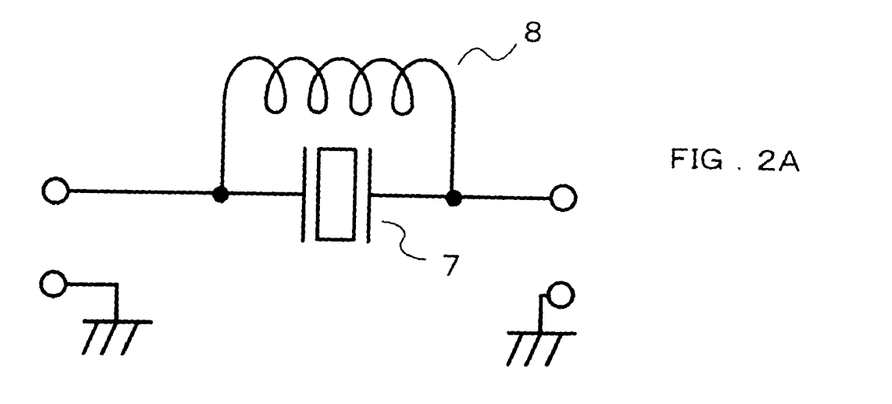
FIG. 2A is a circuit diagram showing a SAW resonator in a series arm with an inductor connected parallel thereto.
Figure 2B:
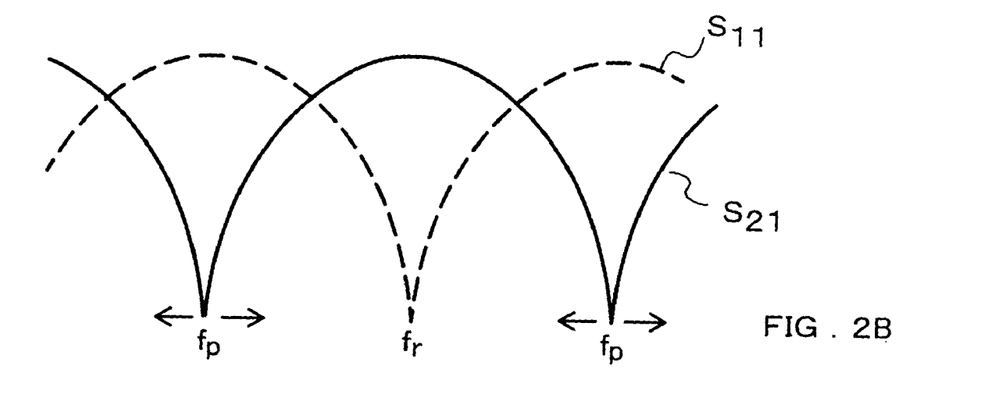
FIG. 2B is a graph showing the manner in which S parameters change.

The characteristics of an assembly comprising a SAW resonator in a series arm and an inductor connected parallel to the SAW resonator will be described below. If inductor 8 is connected parallel to SAW resonator 7 in a series arm as shown in FIG. 2A, the frequency changes of S parameters ($S_{11}$, $S_{21}$) of this circuit are as shown in FIG. 2B. Specifically, the frequency of anti-resonance point $f_r$ remains constant as indicated by broken-line characteristic curve $S_{11}$, and the frequency of apparent resonance point $f_p$ of the SAW resonator changes depending on the inductance value of inductor 8 as indicated by solid-line characteristic curve $S_{21}$.

It is assumed that SAW resonators 1 to 4 of the circuit shown in FIG. 1 have resonance points represented respectively by $f_{p1}$ to $f_{p4}$ and anti-resonance points represented respectively by $f_{r1}$ to $f_{r4}$. It is also assumed that these resonance and anti-resonance points are apparent resonance and anti-resonance points provided by the connection of reactive elements such as inductors. The circuit shown in FIG. 1, i.e., the SAW filter according to the present embodiment has frequency characteristics as shown in FIG. 2C.

Figure 2C:
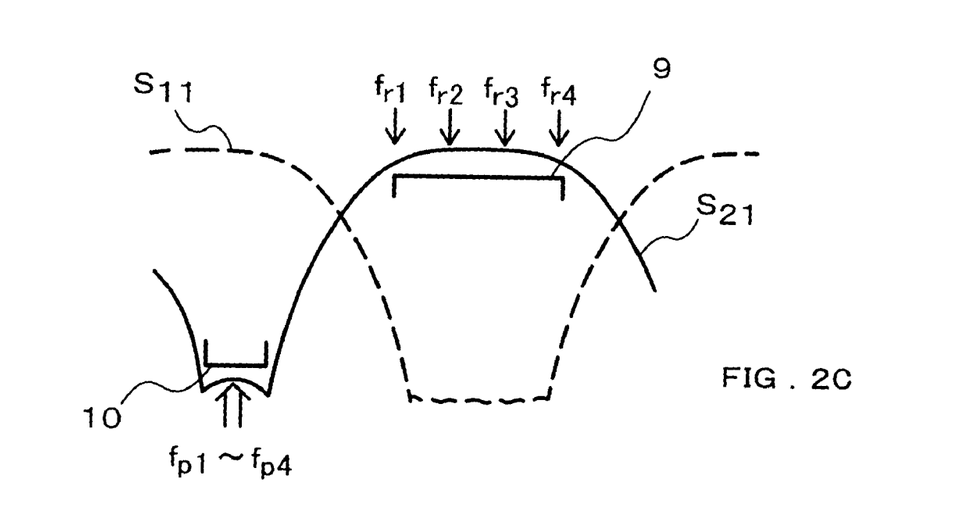
FIG. 2C is a graph showing the characteristics of the filter illustrated in FIG. 1.

In the present embodiment, adjustments are made to position the frequencies of resonance points $f_{p1}$, $f_{p2}$ produced by SAW resonators 1, 2 in the series arms and inductors 5, 6 substantially on attenuation peak 10 on solid-line characteristic curve $S_{21}$ of the filter characteristics shown in FIG. 2C, and to position the frequencies of anti-resonance points $f_{r1}$, $f_{r2}$ substantially in passband 9 of broken-line characteristic curve $S_{11}$ of the filter characteristics shown in FIG. 2C. Such adjustments can be achieved by designing SAW resonators 1, 2 to bring anti-resonance points $f_{r1}$, $f_{r2}$ in the above range and selecting the inductance values of inductors 5, 6 connected parallel to SAW resonators 1, 2 to cause resonance points $f_{p1}$, $f_{p2}$ to have respective desired values.

Similarly, adjustments are also made to position the frequencies of resonance points $f_{p3}$, $f_{p4}$ of SAW resonators 3, 4 in the parallel arms substantially on attenuation peak 10, and to position the frequencies of anti-resonance points $f_{r3}$, $f_{r4}$ substantially in passband 9. SAW resonators 3, 4 are designed such that resonance points $f_{p3}$, $f_{p4}$ and anti-resonance points $f_{r3}$, $f_{r4}$ satisfy these values.

In general, it is impossible for a single SAW resonator alone to bring frequency $f_r$ of an anti-resonance point away from frequency $f_p$ of a resonance point by a certain frequency or more. According to the circuit shown in FIG. 1, however, the frequencies of resonance points can be changed by connecting inductors 5, 6 parallel to SAW resonators 1, 2, respectively, with the result that frequency $f_r$ of the anti-resonance point can be brought highly apart from frequency $f_p$ of the resonance point. Therefore, the SAW filter according to the present embodiment can achieve a large passband width by placing the frequencies of anti-resonance points $f_{r1}$ to $f_{r4}$ of SAW resonators 1 to 4 in a dispersed fashion depending on a desired passband width, and can also accomplish a large attenuation level outside of the passband by placing the frequencies of resonance points $f_{p1}$ to $f_{p4}$ as closely to each other as possible.

With the circuit shown in FIG. 1, since inductors 5, 6 are connected parallel to SAW resonators 1, 2 in the series arms, respectively, the pure resistance components of inductors 5, 6 do not cause an insertion loss on the filter characteristics. Consequently, the circuit shown in FIG. 1 causes a highly small insertion loss. For example, a simulation conducted on a filter having the structure shown in FIG. 1 indicated that the filter had an insertion loss of 0.3 dB and an attenuation level of 55 dB at a fractional band width of 9% or more. Therefore, the filter according to the present embodiment has a wide passband, suffers a small insertion loss, and provides a large attenuation level outside of the passband.

The circuit arrangement shown in FIG. 1 makes it possible to adjust the filter characteristics by selecting inductors of optimum inductance values in a process of assembling the filter, and hence achieves filter characteristics of a wide passband and a large attenuation level outside of the passband.

If an inductor is connected in series to a SAW resonator, then the inductor may be required to have a large inductance value depending on the characteristics that the filter is required to have and hence may present a large resistance. If the filter itself is reduced in size, then the windings of the inductor need to have a smaller diameter, and hence present a large resistance. Accordingly, if an inductor is connected in series to a SAW resonator, particularly, a SAW resonator in a series arm, then the filter may cause such a large insertion loss that it may not be practical in use. According to the present embodiment, however, since the inductors are connected parallel to the SAW resonators, the filter does not cause a large insertion loss.

The SAW filter according to the present invention is not limited to the above structure and may be of any of various structures insofar as an inductor is connected parallel to at least one SAW resonator.

Figure 3:
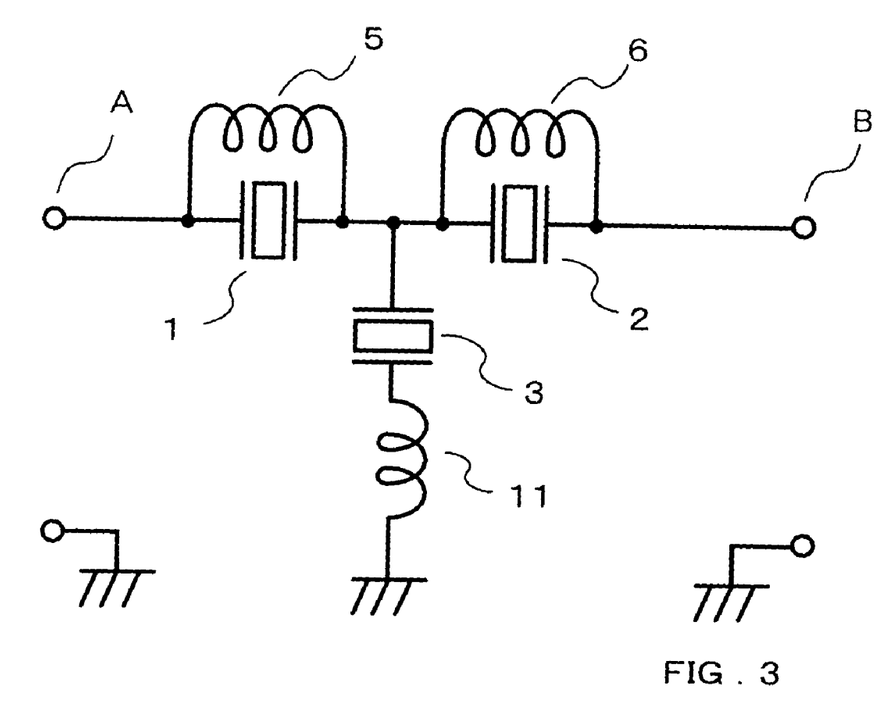
FIG. 3 is a circuit diagram of a SAW filter according to another embodiment of the present invention.

FIG. 3 shows a SAW filter according to another embodiment of the present invention. The SAW filter has inductors connected parallel to SAW resonators in series arms and an inductor connected in series to a SAW resonator in a parallel arm. Specifically, the SAW filter shown in FIG. 3 is a modification of the SAW filter shown in FIG. 1 constructed by removing SAW resonator 4 in the parallel arm from the SAW filter shown in FIG. 1 and inserting inductor 11 between SAW resonator 3 in the parallel arm and a ground point.

Figure 4A:
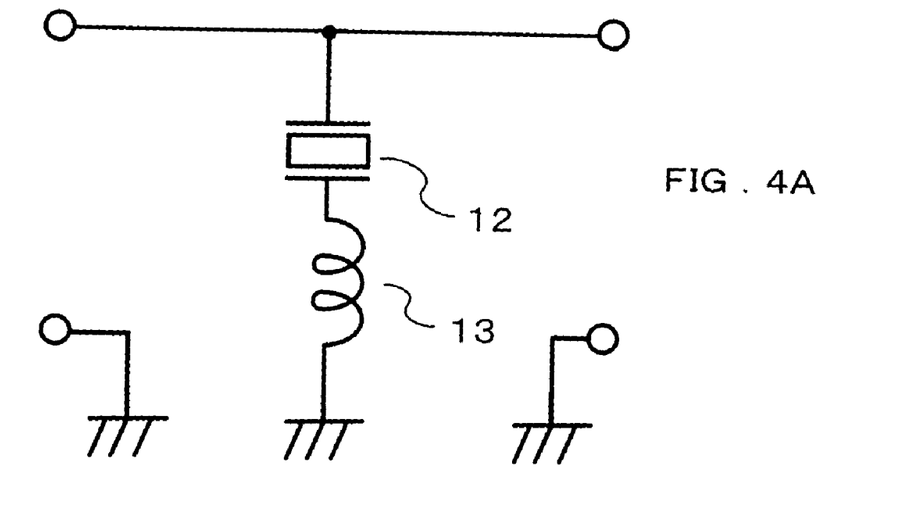
FIG. 4A is a circuit diagram showing a SAW resonator in a parallel arm with an inductor connected in series thereto.
Figure 4B:
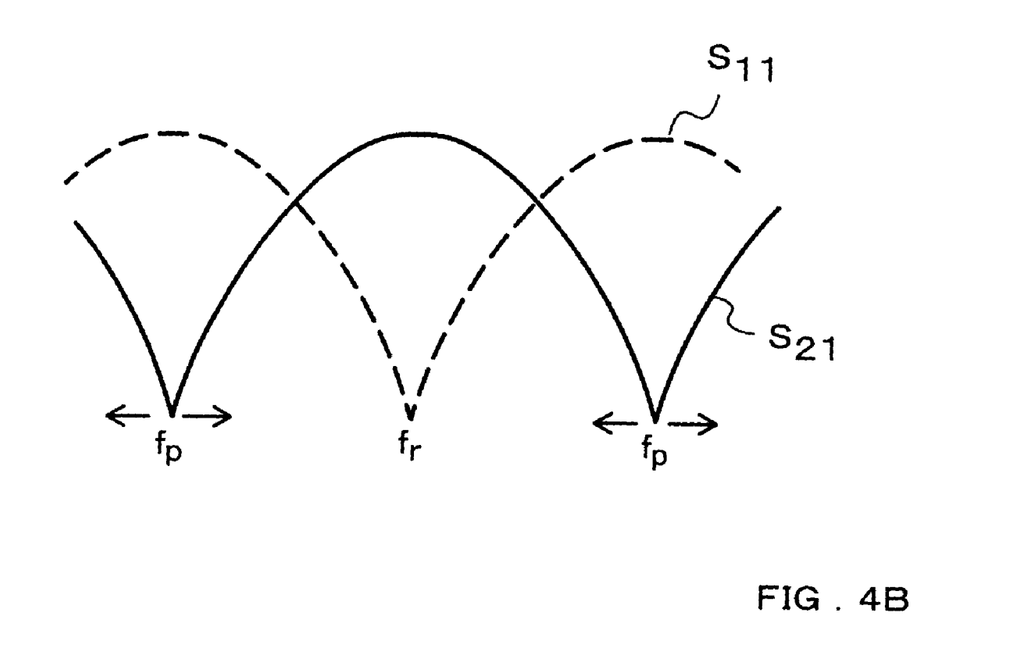
FIG. 4B is a graph showing the manner in which S parameters change.

The characteristics of an assembly comprising a SAW resonator in a parallel arm and an inductor connected in series to the SAW resonator will be described below. As shown in FIG. 4A, inductor 13 is connected in series to SAW resonator 12 in a parallel arm. Frequency changes of S parameters ($S_{11}$, $S_{21}$) of the circuit shown in FIG. 4A are as shown in FIG. 4B. Specifically, the frequency of anti-resonance point $f_r$ remains constant as indicated by broken-line characteristic curve $S_{11}$, and the frequency of apparent resonance point $f_p$ of the SAW resonator changes depending on the inductance value of inductor 13 as indicated by solid-line characteristic curve $S_{21}$. Therefore, if an inductor is connected in series to a SAW resonator in a parallel arm, then anti-resonance point $f_r$ of SAW resonator 12 may be positioned in the passband of the filter, and resonance point $f_p$ may be positioned on the attenuation peak of the filter by adjusting inductor 13.

The SAW filter shown in FIG. 3 has more inductors and more elements adjustable to achieve optimum filter characteristics than the SAW filter shown in FIG. 1. Therefore, the SAW filter shown in FIG. 3 can be adjusted more easily to achieve optimum filter characteristics than the SAW filter shown in FIG. 1.

Figure 5:
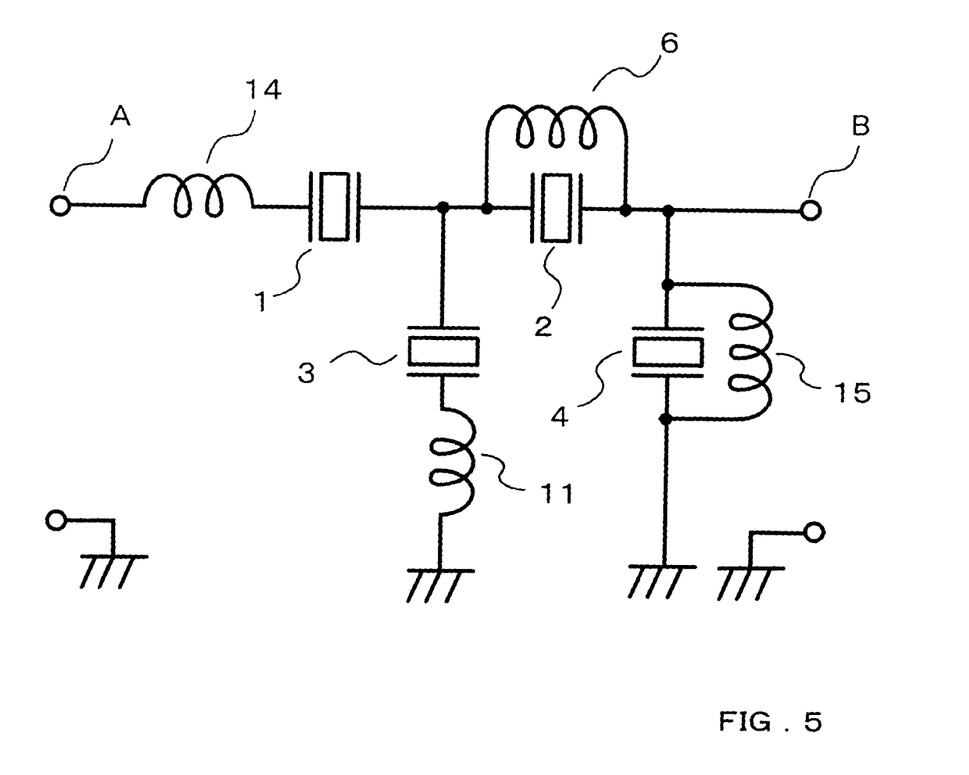
FIG. 5 is a circuit diagram of a SAW filter according to still another embodiment of the present invention.

FIG. 5 shows a SAW filter according to still another embodiment of the present invention. The SAW filter shown in FIG. 5 is a modification of the SAW filter shown in FIG. 1 constructed by removing inductor 5 connected parallel to SAW resonator 1 in the series arm from the SAW filter shown in FIG. 1, inserting inductor 14 between SAW resonator 1 and input terminal A, inserting inductor 11 between SAW resonator 3 in the parallel arm and a ground point, and connecting inductor 15 parallel to SAW resonator 4 in the parallel arm. In the SAW filter shown in FIG. 5, therefore, inductors 14, 11 are connected in series to SAW resonators 1, 3, respectively. Inductors 11, 15 may not necessarily be included in the SAW filter shown in FIG. 5.

Figure 6A:
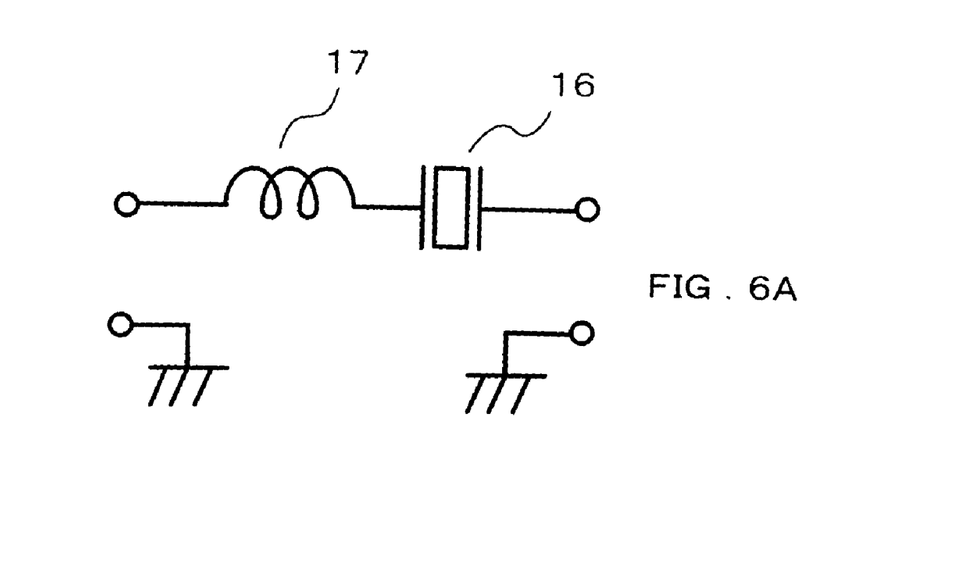
FIG. 6A is a circuit diagram showing a SAW resonator in a series arm with an inductor connected in series thereto.
Figure 6B:
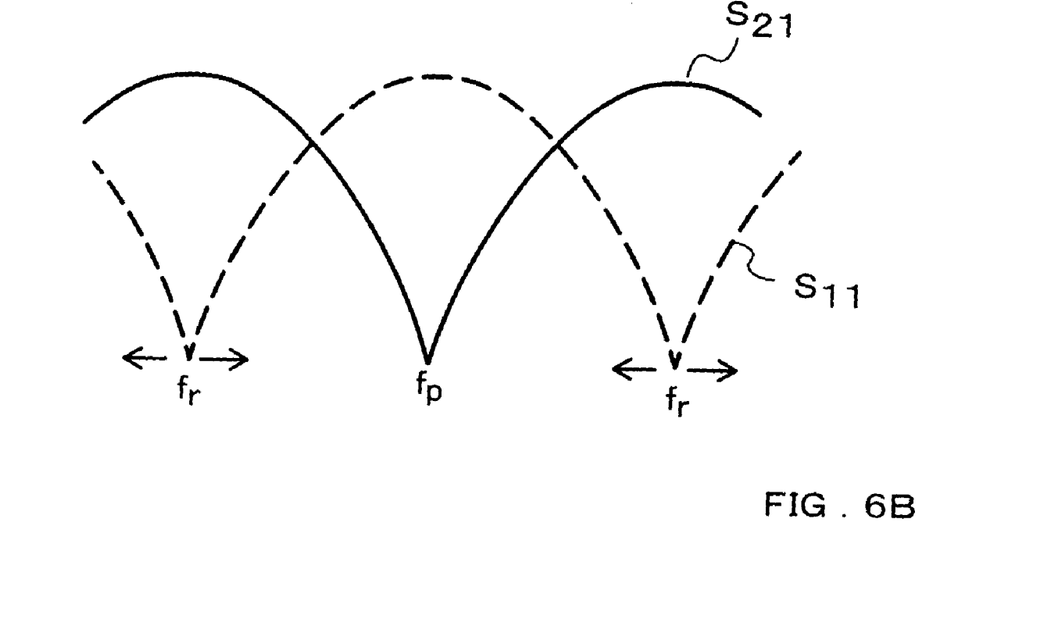
FIG. 6B is a graph showing the manner in which S parameters change.

As shown in FIG. 6A, if inductor 17 is connected in series to SAW resonator 16 in a series arm, then the frequency of resonance point $f_p$ remains constant as indicated by solid-line characteristic curve $S_{21}$, and the frequency of anti-resonance point $f_r$ of the SAW resonator changes depending on the inductance value of inductor 17 as indicated by broken-line characteristic curve $S_{11}$, as shown in FIG. 6B. Therefore, if an inductor is connected in series to a SAW resonator in a series arm, then resonance point $f_p$ of SAW resonator 16 may be positioned on the attenuation peak of the filter, and anti-resonance point $f_r$ may be positioned in the passband of the filter by adjusting inductor 17.

Figure 7A:
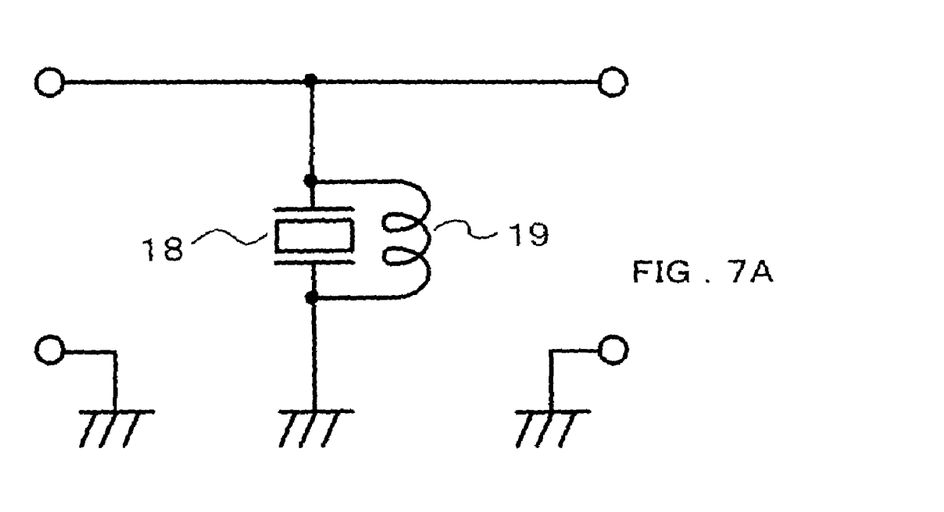
FIG. 7A is a circuit diagram showing a SAW resonator in a parallel arm with an inductor connected parallel thereto.
Figure 7B:
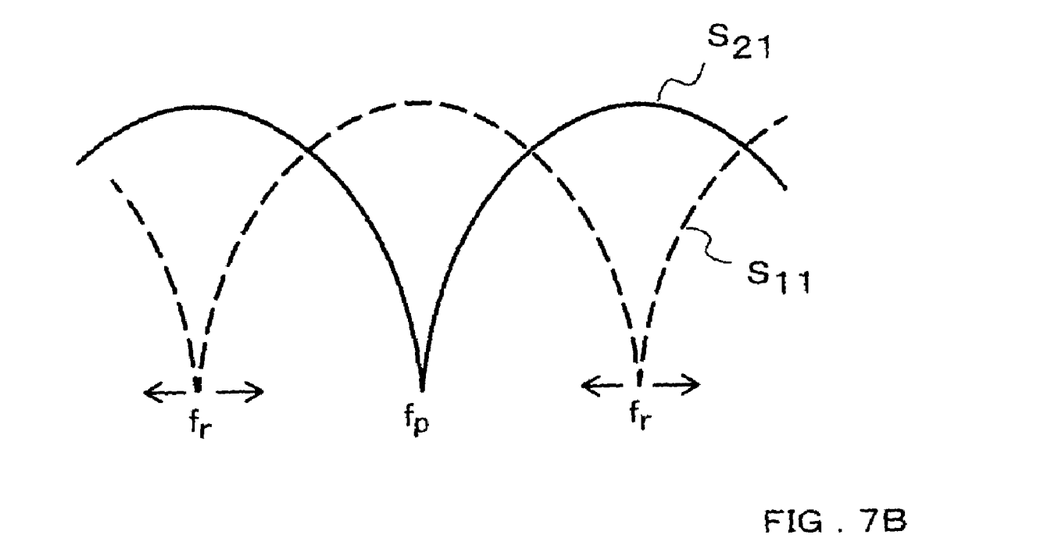
FIG. 7B is a graph showing the manner in which S parameters change.

As shown in FIG. 7A, if inductor 19 is connected parallel to SAW resonator 18 in a parallel arm, then the frequency of resonance point $f_p$ remains constant as indicated by solid-line characteristic curve $S_{21}$, and the frequency of anti-resonance point $f_r$ of the SAW resonator changes depending on the inductance value of inductor 19 as indicated by broken-line characteristic curve $S_{11}$ as shown in FIG. 7B. Therefore, if an inductor is connected parallel to a SAW resonator in a parallel arm, then resonance point $f_p$ of SAW resonator 17 may be positioned on the attenuation peak of the filter, and anti-resonance point $f_r$ may be positioned in the passband of the filter by adjusting inductor 19.

The filter constructed as shown in FIG. 5 has much more reactive elements that can be adjusted, and hence can easily achieve desired characteristics.

The present invention has been described above with respect to SAW filters having inductors connected parallel or in series to SAW resonators for changing the frequency of a resonance point or an anti-resonance point. However, the present invention is not limited to the structures described above, but changes may be made thereto. For example, a capacitor may be connected parallel or in series to a SAW resonator for changing the resonant frequency. Using a capacitor is advantageous in that it can achieve a sharp attenuation curve though it generally is difficult to provide a wide passband.

What is claimed is:

1. A ladder SAW filter, comprising:
   a first SAW resonator disposed in a parallel arm;
   a second SAW resonator disposed in a series arm;
   a first inductor connected parallel to at least one of said first SAW resonator and said second SAW resonator, wherein frequency of a resonance point or an anti-resonance point of said at least one of the first SAW resonator and the second SAW resonator is adjusted by said first inductor; and
   a second inductor connected in series to the other of said first SAW resonator and said second SAW resonator to which said first inductor is not connected parallel.

2. The ladder SAW filter according to claim 1, comprising a plurality of cascaded units each comprising said first SAW resonator and said second SAW resonator.

3. The ladder SAW filter according to claim 1, wherein said inductor is connected parallel to said second SAW resonator, the frequency of an anti-resonance point of said second SAW resonator is set substantially in a passband of said filter characteristics of the ladder SAW filter, and the frequency of a resonance point of said second SAW resonator is set on an attenuation peak of said filter characteristics depending on an inductance value of said inductor.

4. The ladder SAW filter according to claim 3, wherein the frequency of a resonance point of said first SAW resonator is set substantially in the attenuation peak of said filter characteristics, and the frequency of an anti-resonance point of said first SAW resonator is set in the passband of said filter characteristics.

5. The ladder SAW filter according to claim 4, comprising a plurality of cascaded units each comprising said first SAW resonator and said second SAW resonator.

6. The ladder SAW filter according to claim 1, wherein said inductor is connected parallel to said first SAW resonator, the frequency of a resonance point of said first SAW resonator is set substantially on an attenuation peak of said filter characteristics of the ladder SAW filter, and the frequency of an anti-resonance point of said first SAW resonator is set in a passband of said filter characteristics depending on an inductance value of said inductor.

* * * * *